(12) United States Patent
Dang et al.

(10) Patent No.: US 8,419,895 B2
(45) Date of Patent: Apr. 16, 2013

(54) LASER ABLATION FOR INTEGRATED CIRCUIT FABRICATION

(75) Inventors: Bing Dang, Chappaqua, NY (US); John Knickerbocker, Yorktown Heights, NY (US); Aparna Prabhakar, North White Plains, NY (US); Peter Sorce, Poughkeepsie, NY (US); Robert E. Trzcinski, Rhinebeck, NY (US); Cornelia K. Tsang, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 336 days.

(21) Appl. No.: 12/788,843

(22) Filed: May 27, 2010

(65) Prior Publication Data

US 2011/0290406 A1    Dec. 1, 2011

(51) Int. Cl.
*B32B 38/10*    (2006.01)
(52) U.S. Cl.
USPC ........... 156/703; 156/712; 156/753; 156/930; 438/976
(58) Field of Classification Search ................... 156/703, 156/704, 712, 753, 930
See application file for complete search history.

(56) References Cited

U.S. PATENT DOCUMENTS

| | | | |
|---|---|---|---|
| 2009/0032920 A1* | 2/2009 | Buchwalter et al. | 257/676 |
| 2009/0221217 A1 | 9/2009 | Gajaria et al. | |
| 2009/0311849 A1 | 12/2009 | Andry et al. | |
| 2010/0038127 A1 | 2/2010 | Brist et al. | |

OTHER PUBLICATIONS

Andry et al., Method of Separating Integrated Circuit Chips Fabricated on a Wafer, Filed Jun. 17, 2008, U.S. Appl. No. 12/140,492, IBM Corporation.

\* cited by examiner

*Primary Examiner* — Mark A Osele
(74) *Attorney, Agent, or Firm* — Cantor Colburn LLP; Louis Percello

(57) ABSTRACT

A method for releasing a handler from a wafer, the wafer comprising an integrated circuit (IC) includes attaching the handler to the wafer using an adhesive comprising a polymer; performing edge processing to remove an excess portion of the adhesive from an edge of the handler and wafer; ablating the adhesive through the handler using a laser, wherein a wavelength of the laser is selected based on the transparency of the handler material; and separating the handler from the wafer. A system for releasing a handler from a wafer, the wafer comprising an IC includes a handler attached to a wafer using an adhesive comprising a polymer; an edge processing module, the edge processing module configured to remove an excess portion of the adhesive from the edge of the handler and wafer; and a laser, the laser configured to ablate the adhesive through the handler.

20 Claims, 6 Drawing Sheets

100

| ATTACH HANDLER TO WAFER USING ADHESIVE; PROCESS WAFER |
| 101 |

| PERFORM EDGE PROCESSING ON EDGE OF HANDLER/WAFER |
| 102 |

| ABLATE ADHESIVE USING LASER |
| 103 |

| RELEASE HANDLER FROM WAFER; REMOVE ANY REMAINING ADHESIVE FROM WAFER |
| 104 |

LASER ABLATION FOR INTEGRATED CIRCUIT FABRICATION

CROSS-REFERENCE TO RELATED APPLICATION

This application is related to attorney docket numbers YOR920100151US1 and YOR920100152US1, each assigned to International Business Machines Corporation (IBM) and filed on the same day as the instant application, all of which are herein incorporated by reference in their entirety.

FIELD

This disclosure relates generally to the field of integrated circuit fabrication.

DESCRIPTION OF RELATED ART

Multiple integrated circuit (IC) products, which may be referred to as chips or dies, may be formed on a larger semiconductor substrate, referred to as a wafer. The IC fabrication process may comprise fabrication of multiple complementary metal-oxide-semiconductor (CMOS) devices on the wafer. If the wafer is relatively thin, an adhesive may be used to attach the wafer to a rigid handler, so that the handler may provide mechanical support for the wafer during the CMOS fabrication processes. However, the CMOS fabrication process may include chemical processing and/or high temperature processing, which may reach temperatures up to 400° C., which may cause the adhesive to break down.

The wafer may be released from the handler after CMOS fabrication is completed. Some methods of handler release include use of a temperature-sensitive adhesive or a chemically dissolvable adhesive. However, a temperature-sensitive adhesive may only adhere the handler to the chip at temperatures under about 300° C. or lower. A chemically dissolvable adhesive may also only be appropriate for relatively low-temperature processing, and may require use of a specialized handler material to allow the release chemicals to diffuse through the handler in order to dissolve the adhesive. Wax sliding is another release method, but it is also limited to relatively low temperature processing, and may require a special sliding mechanism.

SUMMARY

In one aspect, a method for releasing a handler from a wafer, the wafer comprising an integrated circuit (IC) includes attaching the handler to the wafer using an adhesive comprising a polymer; performing edge processing to remove an excess portion of the adhesive from an edge of the handler and wafer; ablating the adhesive through the handler using a laser, wherein a wavelength of the laser is selected based on the transparency of the handler material; and separating the handler from the wafer.

In one aspect, a system for releasing a handler from a wafer, the wafer comprising an IC includes a handler attached to a wafer using an adhesive comprising a polymer; an edge processing module, the edge processing module configured to remove an excess portion of the adhesive from the edge of the handler and wafer; and a laser, the laser configured to ablate the adhesive through the handler.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of systems and methods for laser ablation of adhesive for IC fabrication are provided, with exemplary embodiments being discussed below in detail. Appropriate selection of a handler material, an adhesive, and a laser having a specified wavelength allows for attachment of a handler to a CMOS wafer using the adhesive, and subsequent release of the handler from the wafer using laser ablation without contamination of or damage to the wafer. The adhesive may comprise a polymer, including but not limited to a thermoset polymer and/or a polyimide-based polymer, that may withstand temperatures up to about 400° C. as well as any chemical process that may occur during the fabrication process. The release process may be relatively fast, allowing good throughput for the overall IC fabrication process.

Figure 1:
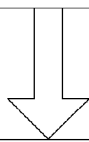
FIG. 1 illustrates an embodiment of a method for attachment and release of a handler to a wafer using laser ablation.
Figure 1:
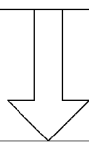
Figure 1:
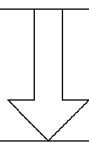
Figure 2:
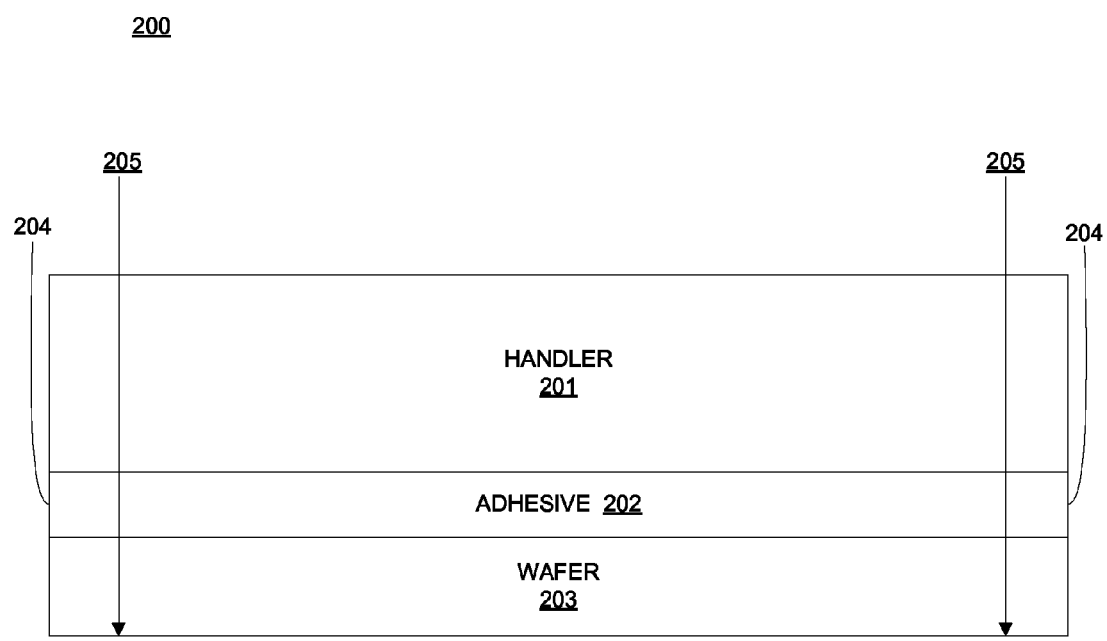
FIG. 2 illustrates an embodiment of a handler attached to a wafer using an adhesive.

FIG. 1 illustrates an embodiment of a method for attachment and release of a handler to a wafer using laser ablation. FIG. 1 is discussed with reference to FIGS. 2-9. In block 101, a handler 201 is attached to a wafer 203 using an adhesive 202, as shown in FIG. 2. The wafer 203 may comprise a thinned substrate, and may be between about 700 and 800 microns (μm) thick in some embodiments. The adhesive 202 may comprise a polymer, including but not limited to a thermoset polymer and/or a polyimide-based polymer, and may withstand high-temperature processing at over 280° C. in some embodiments, and in the range of about 350° C. to about 400° C. in some preferred embodiments. The adhesive 202 may be applied to wafer 203 by spin application, and then the handler may be placed on the adhesive 202 in some embodiments.

After attachment of handler 201, processing, which may include CMOS fabrication processing, may be performed on wafer 203. The processed wafer 203 may comprise any appropriate CMOS devices, including silicon-based 3-dimensional (3D) or 4-dimensional (4D) IC chips, and may comprise electrical contacts and/or vias in some embodiments. The wafer 203 may comprise a solar cell, including but not limited to a thin film solar cell, a solar cell comprising a copper-indium-gallanide-selenium (CIGS) based thin film, a silicon solar cell, or a glass substrate based solar cell.

Handler 201 provides mechanical support to wafer 203 during processing. Handler 201 may comprise a relatively rigid material that is transparent in the range 193 nanometers (nm) to 400 nm in some embodiments, and in some preferred embodiments in the range of 248 nm to 351 nm, including but not limited to quartz, glass, diamond, or sapphire. Handler 201 may be selected such that the coefficient of thermal expansion (CTE) of handler 201 is closely matched to the CTE of the material comprising wafer 203. Handler 201 may comprise electrical vias with connections that mate to any electrical contacts on wafer 203, allowing device 200 comprising handler 201 to be used in a test apparatus before release of handler 201 in some embodiments. Handler 201 may further comprise one or more additional layers of optical energy absorbing material located at the interface between adhesive 202 and handler 201, including but not limited to one or more layers of thin sputtered metal a thin layer, or a layer of an additional polymer material.

The adhesive 202 may be thicker at the edge 204 of the device 200 than at the middle, which may optionally require special processing of the adhesive at the edge 204 of device 200 in block 102 before laser ablation (discussed below with respect to block 103). In some embodiments, a chemical may be applied to the edge 204 to dissolve or weaken the adhesive 202 located at the edge 204 of the device 200. The chemical may be applied by immersion of device 200 in the chemical for an appropriate amount of time in some embodiments. In some embodiments, a focused ion beam or a high-energy electron beam may be applied to edge 204 to remove adhesive 202 located at the edge 204. In some embodiments the device 200 may be exposed to a vacuum or atmospheric pressure plasma environment whereby plasma disintegrates adhesive 202 located around the edge 204 of device 200. In some embodiments, the device 200 may be exposed to a supercritical solvent environment containing chemicals selected to degrade the adhesive 202, allowing for penetration of the solvents around the edge 204 of device 200.

The edge 204 may also be removed using an edge deletion technique, which may comprise dicing, or any appropriate abrasive or mechanical cutting of the edge of device 200 at lines 205 to remove the portions having relatively thick adhesive 202 at edge 204. The removed portion may be selected so as not to remove or damage the active portion (containing, for example, any CMOS devices) of the wafer 203. Dicing using repetitive tangential patterns on the outer diameter of wafer 203 may be used to remove the inactive area of wafer 203. Lines 205 are shown for illustrative purposes only; the edge deletion may remove any appropriate portion of device 200.

Figure 3:
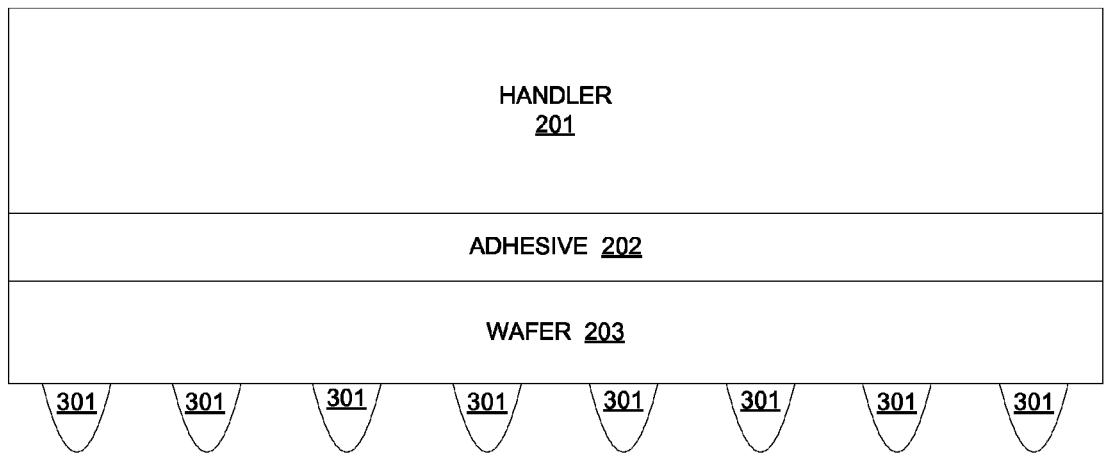
FIG. 3 illustrates an embodiment of the device of FIG. 2 after C4 processing.
Figure 4:
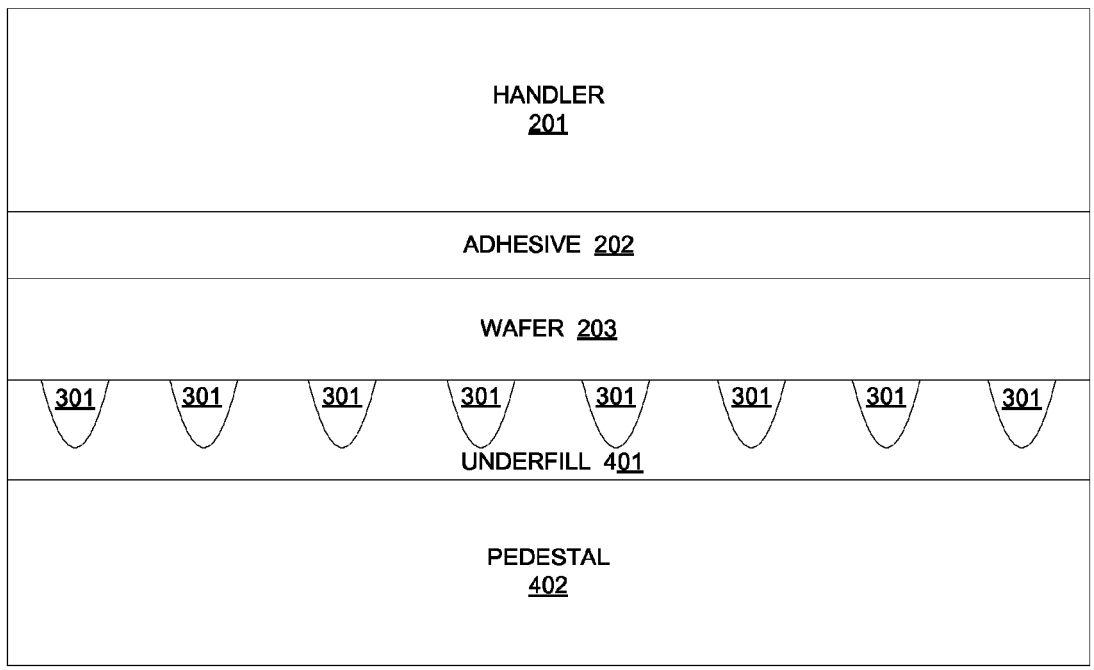
FIG. 4 illustrates an embodiment of the device of FIG. 3 after underfilling and attachment to a pedestal.

The CMOS processing of block 101 may further comprise fabrication of a C4 layer on wafer 203, as is shown in FIG. 3. The C4 layer may comprise a plurality of electrical contacts 301. The C4 layer may have a non-uniform distribution on wafer 203, which may cause damage to the wafer 203 during laser ablation (discussed below with respect to block 103). Therefore, in block 102, as shown in FIG. 4, the wafer 203 may be underfilled using underfill material 401 on the side of wafer 203 comprising C4 contacts 301 in order to offer a uniform surface during the laser ablation process, resulting in separation of handler 201 from the wafer 203 without damage. The underfill material 401 may be selected so as to not damage functionality of wafer 203, and may comprise any appropriate type of flux, epoxy, or gel, or water. Pedestal 402 may then be placed under underfill material 401. Pedestal 402 may comprise a ceramic in some embodiments. C4 contacts 301 are shown for illustrative purposes only; wafer 203 may comprise any appropriate distribution of C4 contacts.

Figure 5:
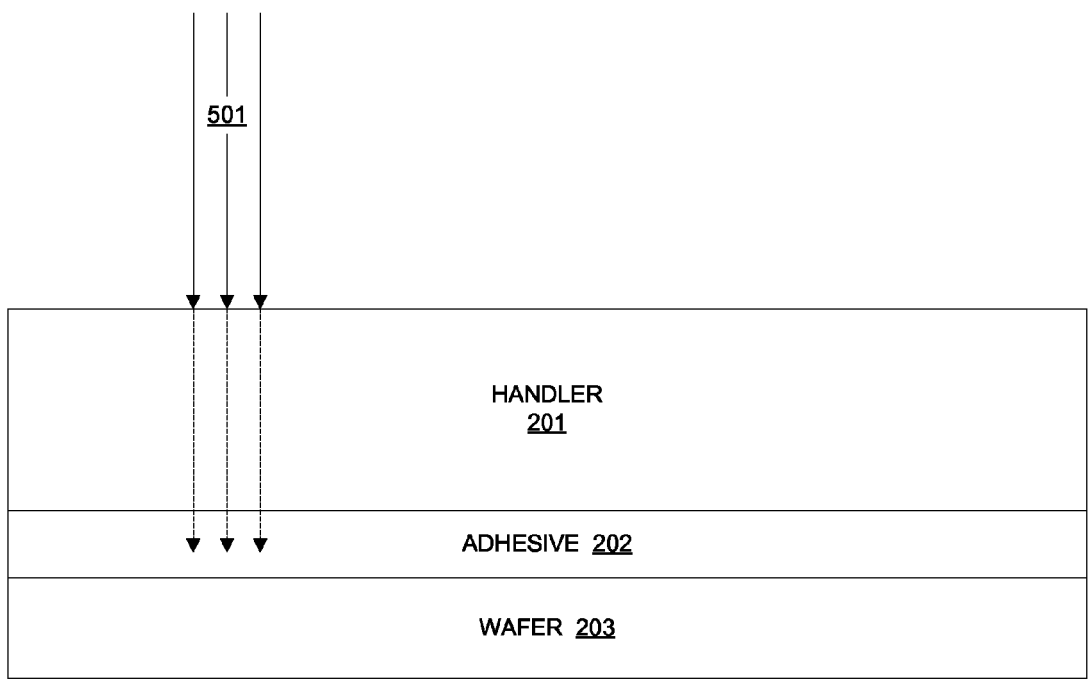
FIG. 5 illustrates an embodiment of the device of FIG. 3 during laser ablation.

In block 103, as shown in FIG. 5, the adhesive 202 is ablated by a laser 501, which may comprise ultraviolet (UV) light having a wavelength between about 193 nm to about 400 nm in some embodiments, and between about 248 nm to about 351 nm in some preferred embodiments. In embodiments in which handler 201 comprises quartz, laser 301 may have a wavelength of about 193 nm. Energy from laser 501 passes through handler 201 and is absorbed by adhesive 202, causing the adhesive 202 to carbonize or vaporize, allowing release of handler 201. Depending on the laser wavelength and the handler material, transmission of the energy from the laser 501 through handler 201 may be greater than 80%, and the light absorption depth in the adhesive 202 may be less than 1 µm. Laser 501 may be directed at an angle to handler 201 in some embodiments; the angle may be selected to reduce or eliminate edge diffraction of the laser 501 as it travels through the handler 201. While C4 contacts 301, underfill material 401, and pedestal 402 are not shown in FIG. 5, device 500 may comprise C4 contacts 301, underfill material 401, and pedestal 402 in some embodiments. In other embodiments, the device comprising wafer 203, handler 201, and adhesive 202 may be mounted on a rotary stage (embodiments of which are shown, for example, in FIG. 7, element 702, and FIG. 8, element 802 of Attorney Docket Number YOR920100153US1) that may move as needed in any appropriate direction during ablation by laser 501 in order to ablate adhesive 202 across the entire surface of handler 201.

Over-ablation by laser 501 may cause damage to wafer 203. In embodiments in which laser 501 comprises a pulsed laser source, not all areas of handler 201 may separate evenly from wafer 203 due, for example, to uneven application of the laser energy across the surface of hander 201. Multiple passes of laser 501 over areas that do not separate with a single pass may be required, which may damage wafer 203. Further, wafer 203 may be damaged by the diving board effect. In the diving board effect, one portion of wafer 203 is released from handler 201, and the release progresses from the released portion to another portion of the wafer 203 that is still attached to handler 201, which may cause a top layer of the wafer 203 to pivot on the unreleased portion of the wafer substrate due to acoustic bounce The substrate of wafer 203 may be damaged at the fulcrum point of the pivot. Various techniques which are discussed below, including detection of acoustic signature and visual ablation detection, may be employed during laser ablation in order to avoid damage to wafer 203 from over-ablation.

The acoustic signature of the portion of wafer 203 under ablation may be detected, and the fluence of laser 501 or the stage rotation and/or speed may be modulated in order to encourage release of handler 201 without damage to wafer 203 based on the acoustic signature, as a change in the acoustic signature may indicate separation of handler 201 from the wafer 203. An acoustic or vibration sensor may be integrated into a rotary stage or a pedestal (such as pedestal 402 of FIG. 4) that wafer 203 is mounted on during ablation, and the sensor may be configured to detect the any changes in the acoustic signature of the portion of the wafer 203 under ablation. The acoustic or vibration sensor may then send a signal to an attenuator to adjust the movement of the rotary stage and/or stop the laser 501 based on any detected change in the acoustic signature, preventing damage to wafer 203 due to over-ablation.

The adhesive 202 may also change color when the adhesive 202 is fully ablated (i.e., carbonized or vaporized) by laser 501. A visual image of the adhesive 202 under ablation by laser 501 may be captured in order to identify any color changes that occur in adhesive 202. A detected change in the color of adhesive 202 may be used to determine if there is a need to stop laser ablation, or to increase any laser parameters or perform an additional pass of laser 501 over the surface of handler 201 if adhesive 202 is not fully ablated.

Figure 6:
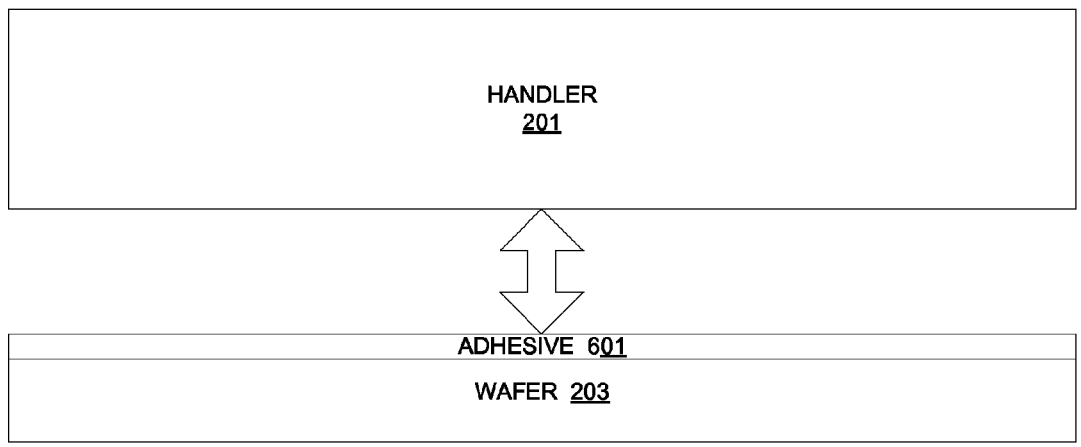
FIG. 6 illustrates an embodiment of the device of FIG. 5 after handler release.

In block 104, as shown in FIG. 6, the handler 201 is released from wafer 203. Release of handler 201 may result in a portion of ablated adhesive 401 remaining on wafer 203 in some embodiments. Any remaining ablated adhesive 401 may be removed, using, for example, a wet soak, resulting in wafer 203.

The technical effects and benefits of exemplary embodiments include attachment and release of a handler to a wafer while avoiding damage to the wafer.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method for releasing a handler from a wafer, the wafer comprising an integrated circuit (IC), the method comprising:
   attaching the handler to the wafer using an adhesive comprising a polymer;
   performing edge processing to remove an excess portion of the adhesive from an edge of the handler and wafer, wherein edge processing comprises removing a nonactive portion of the wafer located at the edge by cutting the handler and wafer;
   ablating the adhesive through the handler using a laser, wherein a wavelength of the laser is selected based on the transparency of the handler material; and
   separating the handler from the wafer.

2. The method of claim 1, wherein edge processing comprises applying a chemical to the edge of the wafer and handler to dissolve the adhesive located at the edge.

3. The method of claim 1, wherein edge processing comprises applying a focused ion beam or a high-energy electron beam to the edge to remove the adhesive located at the edge.

4. The method of claim 1, wherein edge processing comprises exposing the edge to a vacuum or atmospheric pressure plasma environment configured to disintegrate the adhesive located at the edge.

5. The method of claim 1, wherein edge processing comprises exposing the wafer and handler to a super-critical solvent environment containing chemicals selected to degrade the adhesive at the edge.

6. The method of claim 1, wherein cutting comprises dicing using repetitive tangential patterns on an outer diameter of the wafer.

7. The method of claim 1, further comprising:
   forming a C4 layer on the bottom of the wafer after attaching the handler to the wafer;
   underfilling the C4 layer with an underfill material; and
   placing the underfilled C4 layer on a pedestal.

8. The method of claim 7, wherein the underfill material comprises one of flux, epoxy, gel and water.

9. The method of claim 7, wherein the pedestal comprises ceramic.

10. The method of claim 1, wherein edge processing comprises ablating the adhesive through the handler using a laser applied at an angle to a top surface of the handler in order to ablate the adhesive at the edge of the wafer, wherein the angle is selected to reduce diffraction of the laser in the handler.

11. The method of claim 1, wherein the handler comprises a material having a coefficient of thermal expansion (CTE), and wherein the handler material is selected such that the CTE of the handler material is closely matched to a CTE of the wafer.

12. A system for releasing a handler from a wafer, the wafer comprising an integrated circuit (IC), the system comprising:
   a handler attached to a wafer using an adhesive comprising a polymer;
   an edge processing module, the edge processing module configured to remove an excess portion of the adhesive from the edge of the handler and wafer by applying a chemical to the edge of the wafer and handler to dissolve the adhesive located at the edge; and
   a laser, the laser configured to ablate the adhesive through the handler.

13. A method for releasing a handler from a wafer, the wafer comprising an integrated circuit (IC), the method comprising:
   attaching the handler to the wafer using an adhesive comprising a polymer;
   performing edge processing to remove an excess portion of the adhesive from an edge of the handler and wafer;
   ablating the adhesive through the handler using a laser, wherein a wavelength of the laser is selected based on the transparency of the handler material, and wherein ablating the adhesive further comprises detecting an acoustic signature of the wafer during ablation of the adhesive, and stopping ablation based on a detected change in the acoustic signature of the wafer; and
   separating the handler from the wafer.

14. A method for releasing a handler from a wafer, the wafer comprising an integrated circuit (IC), the method comprising:
   attaching the handler to the wafer using an adhesive comprising a polymer;
   performing edge processing to remove an excess portion of the adhesive from an edge of the handler and wafer;
   ablating the adhesive through the handler using a laser, wherein a wavelength of the laser is selected based on the transparency of the handler material, and wherein ablating the adhesive further comprises detecting a change in the color of the adhesive during ablation of the adhesive, and stopping ablation based on the detected change in the color of the adhesive; and
   separating the handler from the wafer.

15. A system for releasing a handler from a wafer, the wafer comprising an integrated circuit (IC), the system comprising:
   a handler attached to a wafer using an adhesive comprising a polymer;
   an edge processing module, the edge processing module configured to remove an excess portion of the adhesive from the edge of the handler and wafer by applying a focused ion beam or a high-energy electron beam to the edge to remove the adhesive located at the edge; and a laser, the laser configured to ablate the adhesive through the handler.

16. A system for releasing a handler from a wafer, the wafer comprising an integrated circuit (IC), the system comprising:

a handler attached to a wafer using an adhesive comprising a polymer;

an edge processing module, the edge processing module configured to remove an excess portion of the adhesive from the edge of the handler and wafer by exposing the edge to a vacuum or atmospheric pressure plasma environment configured to disintegrate the adhesive located at the edge; and a laser, the laser configured to ablate the adhesive through the handler.

17. A system for releasing a handler from a wafer, the wafer comprising an integrated circuit (IC), the system comprising:

a handler attached to a wafer using an adhesive comprising a polymer;

an edge processing module, the edge processing module configured to remove an excess portion of the adhesive from the edge of the handler and wafer by exposing the wafer and handler to a super-critical solvent environment containing chemicals selected to degrade the adhesive at the edge; and a laser, the laser configured to ablate the adhesive through the handler.

18. A system for releasing a handler from a wafer, the wafer comprising an integrated circuit (IC), the system comprising:

a handler attached to a wafer using an adhesive comprising a polymer;

an edge processing module, the edge processing module configured to remove an excess portion of the adhesive from the edge of the handler and wafer by removing a non-active portion of the wafer located at the edge by cutting the handler and wafer; and a laser, the laser configured to ablate the adhesive through the handler.

19. A system for releasing a handler from a wafer, the wafer comprising an integrated circuit (IC), the system comprising:

a handler attached to a wafer using an adhesive comprising a polymer;

an edge processing module, the edge processing module configured to remove an excess portion of the adhesive from the edge of the handler and wafer;

an acoustic sensor, the acoustic sensor configured to detect an acoustic signature of the wafer during ablation of the adhesive, and stop ablation based on a detected change in the acoustic signature of the wafer; and a laser, the laser configured to ablate the adhesive through the handler.

20. A system for releasing a handler from a wafer, the wafer comprising an integrated circuit (IC), the system comprising:

a handler attached to a wafer using an adhesive comprising a polymer;

an edge processing module, the edge processing module configured to remove an excess portion of the adhesive from the edge of the handler and wafer;

a visual sensor configured to detect a change in the color of the adhesive during ablation of the adhesive, and stop ablation based on the detected change in the color of the adhesive; and a laser, the laser configured to ablate the adhesive through the handler.

* * * * *